United States Patent
Sekine

(10) Patent No.: US 6,734,464 B2
(45) Date of Patent: May 11, 2004

(54) HETERO-JUNCTION LASER DIODE

(75) Inventor: Norihiko Sekine, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/280,800

(22) Filed: Oct. 28, 2002

(65) Prior Publication Data

US 2003/0094617 A1 May 22, 2003

(30) Foreign Application Priority Data

Nov. 20, 2001 (JP) .................................... 2001-355287

(51) Int. Cl.$^7$ .............................................. H01L 33/00
(52) U.S. Cl. ............................ 257/79; 257/79; 257/85
(58) Field of Search ............................ 257/75, 97, 22; 372/45, 99, 96, 46; 438/38, 44

(56) References Cited

U.S. PATENT DOCUMENTS

| | | | | |
|---|---|---|---|---|
| 5,685,904 A | * | 11/1997 | Pinzone | ........................ 117/89 |
| 5,799,026 A | * | 8/1998 | Meyer et al. | ................. 372/45 |
| 6,487,230 B1 | * | 11/2002 | Boucart et al. | ............... 372/96 |
| 6,563,851 B1 | * | 5/2003 | Jikutani et al. | ............... 372/45 |

OTHER PUBLICATIONS

Luo et al.; "Purely gain–coupled diStributed feedback semiconductor lasers"; *Applied Physics Letters*, vol. 56, 1620; 1990; pp.1620–1622.

Li et al.; "16–Wavelength Gain–Coupled DFB Laser Array with Fine Tunability"; *IEEE Photonics Technology Letters*, vol. 8, 22; 1996; pp. 22–24.

* cited by examiner

*Primary Examiner*—David Nelms
*Assistant Examiner*—Thinh T Nguyen
(74) *Attorney, Agent, or Firm*—Armstrong, Kratz, Quintos, Hanson & Brooks

(57) ABSTRACT

A laser diode comprises a first cladding layer having a first conductivity, a second cladding layer having a second conductivity, an active layer located between the first cladding layer and the second cladding layer and extending from one end surface to the other end surface, a first electrode configured to inject a carrier with a first polarity into the active layer via the first cladding layer, and a second electrode configured to inject a carrier with a second polarity into the active layer via the second cladding layer. The active layer comprises a first active region and a second active region, which are arranged alternately and periodically from one end surface to the other end surface in the direction of light propagation, and the first active region and the second active region define type-II hetero junction between them.

13 Claims, 9 Drawing Sheets

BAND STRUCTURE OF TYPE-II HETERO JUNCTION

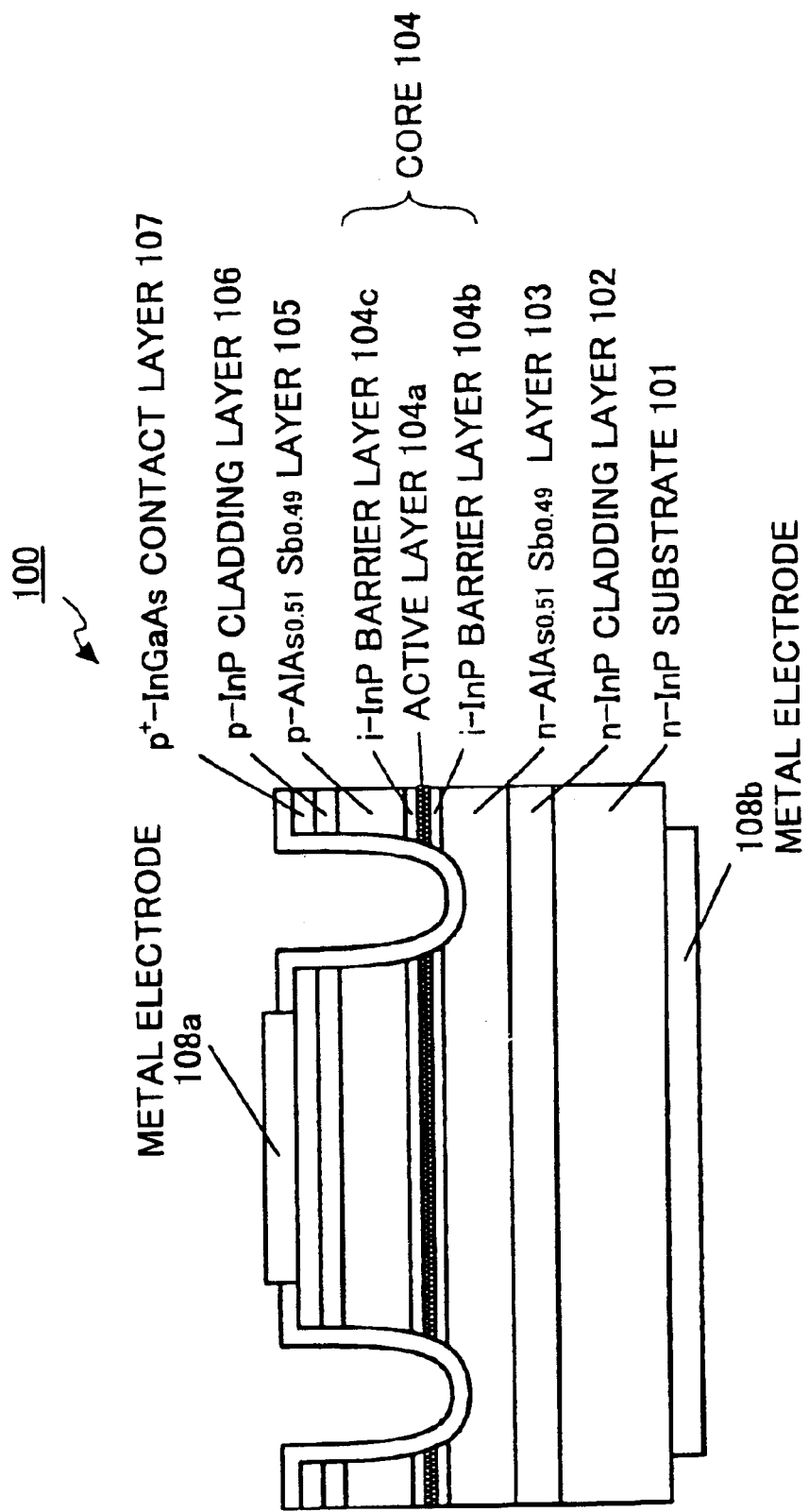

HETERO-JUNCTION LASER DIODE

BACKGROUND OF THE INVENTION

1. Field of the Invention

The present invention generally relates to a laser diode, and more particularly to a gain-coupled distributed-feedback laser diode.

2. Description of the Related Art

Currently, wavelength division multiplexing (WDM) techniques are employed in the backbone transmission system of a high-capacity optical communication network. WDM is a technique for multiplexing optical signals on the wavelength axis to improve the transmission capacity.

The ITU-T grid, which is one of the ITU-T Recommendations announced by the Telecommunication Standardization Sector of the International Telecommunication Union (ITU-T), strictly defines the wavelength and the wavelength interval used in WDM. For this reason, the oscillation wavelength of the laser used as a light source has to be precisely controlled so as to be in conformity with the TTU-T grid.

A refractive index modulated distribution-feedback laser having a quarter wave ($\lambda/4$) phase-shift (hereinafter, referred to as a $\lambda/4$ phase-shift refractive-index-coupled DFB laser) is typically used as a light source for optical communication.

FIG. 1 illustrates a conventional $\lambda/4$ phase-shift refractive-index-coupled DFB laser in a cross-sectional view taken along the longitudinal axis of waveguide extending in the direction of light propagation.

The $\lambda/4$ phase-shift refractive-index-coupled DFB laser 1100 has a diffraction grating 1108 as a refractive index modulating section. The diffraction grating 1108 is provided in the area in which the optical field exists, and it has a periodic refractive index modulation features along the longitudinal axis of optical waveguide (that is, an active layer 1104*a*).

Throughout the optical waveguide (i.e., the active layer 1104*a*), forward waves and backward waves are coupled by the diffraction grating (i.e., the refractive index modulating section) 1108, and a resonator is constituted as a whole, which causes laser oscillation.

The conventional $\lambda/4$ phase-shift refractive-index-coupled DFB laser 1100 has a $\lambda/4$ shift region 1108*a* in the center of the resonator for the purpose of causing single-mode laser oscillation in a stable manner at the Bragg wavelength defined by the period of the diffraction grating.

Since the conventional $\lambda/4$ phase-shift refractive-index-coupled DFB laser 1100 is designed so as to oscillate at the Bragg wavelength, the oscillation wavelength can be easily controlled by adjusting the period of the diffracting grating.

However, in the conventional $\lambda/4$ phase-shift refractive-index-coupled DFB laser 1100, stimulated emission is promoted in the $\lambda/4$ shift region 1108*a* located near the center of the resonator, and consequently, spatial hole burning (SHB) occurs. Spatial hole burning is a phenomenon of local depletion of carrier.

Spatial hole burning (SHB) causes the laser characteristic, especially the characteristic of single wavelength, obtained under application of driving current much higher than the threshold level to deteriorate. For this reason, it is hard to say that the conventional $\lambda/4$ phase-shift refractive-index-coupled DFB laser is the optimum wavelength-multiplexed light source.

Another problem in the conventional $\lambda/4$ phase-shift refractive-index-coupled DFB laser 1100 is the difficulty of achieving a high light-emission efficiency because both ends of the resonator are covered with anti-reflective (AR) coating. Since light disperses at both end surfaces covered with AR coating, light can not be taken out from one end surface at high efficiency.

Furthermore, it is difficult for the conventional $\lambda/4$ phase-shift refractive-index-coupled DFB laser 1100 to increase the normalized coupling factor ($\kappa L$), and therefore, it is weak for reflected return light. The normalized coupling factor is a product of the coupling factor $\kappa$, which corresponds to the reflectance per unit length of the resonator, and the length L of the resonator extending in the direction of light propagation. Increasing the normalized coupling factor is a tradeoff for reducing spatial hole burning (SHB). As the normalized coupling factor ($\kappa L$) increases, the intensity of light reflected inside the resonator increases, and greater quantity of light can be confined in the active layer. However, if the internal light intensity increases, the electric field within the resonator increases, and spatial hole burning (SHB) is more likely to occur, causing deterioration of the characteristic of single wavelength.

To avoid these problems in the conventional refractive-index-coupled DFB laser, it has been proposed to use a gain-coupled DFB laser having a distributed feedback structure based on gain modulation, instead of modulation of the index of refraction.

A gain-coupled DFB laser realizes distributed feedback of light based on periodic modulation of gain. The periodic gain modulation can be achieved by a periodic structure of the active layer repeated along the longitudinal axis of the wave guide (i.e., in the direction of light propagation), or by giving a periodicity to the electric current injected to the active layer. Such an arrangement allows the gain-coupled DFB laser to oscillate at the Bragg wavelength without providing a phase-shift region. The gain-coupled DFB laser not only facilitates regulation of oscillation wavelength, but also reduces the adverse influence of SHB.

Since the gain-coupled DFB laser is superior in achieving a single-wavelength characteristic, high-intensity output light can be obtained by providing high-reflective (HR) coating on one end surface of the resonator.

However, the above-described advantages are limited to a pure gain-coupled DFB laser, in which gain modulation solely exists without other components. As a realistic problem, it is very difficult to fabricate a pure gain-coupled DFB laser.

For example, "16-Wavelength Gain-Coupled DFB Laser Array with Fine Tunability", LEEE Photonics Technology Letters, vol. 8, 22 (1996) discloses a device that modulates a gain using an active layer delineated into a periodic pattern by etching. However, since the active layer extends intermittently, the alternation of existence and absence of the active layer causes the index of refraction to be modulated during the gain modulation. Accordingly, a considerable amount of refractive-index-coupling component is produced inevitably, which can not be neglected in a pure gain-coupled DFB laser.

Another publication "Purely Gain-Coupled Distributed Feedback Semiconductor Lasers", Y. Luo et al., Applied Physics Letters, vol. 56, 1620 (1990) discloses a technique for realizing a pure gain coupling using a pattern-providing layer. However, this technique requires strict and precise control of the thickness of each semiconductor film. This requirement reduces the degree of freedom for design of the laser structure.

SUMMARY OF THE INVENTION

The present invention was conceived in view of these problems existing in the current technique of a gain-coupled DFB laser, and it is an object of the present invention to provide a laser diode that is superior in the single-wavelength characteristic without causing much limitation to the freedom in design of the laser structure.

To achieve the object, a laser diode comprises a first cladding layer having a first conductivity, a second cladding layer having a second conductivity, an active layer located between the first cladding layer and the second cladding layer and extending from one end surface to the other end surface, a first electrode configured to inject a carrier with a first polarity into the active layer via the first cladding layer, and a second electrode configured to inject a carrier with a second polarity into the active layer via the second cladding layer. The active layer comprises a first active region and a second active region, which are arranged alternately and periodically from one end surface to the other end surface in the direction of light propagation, and the first active region and the second active region define type-II hetero junction between them.

This arrangement can efficiently prevent refractive-index-coupling, while maintaining superiority in single-wavelength characteristics. In addition, the degree of freedom for design of the laser structure is large.

Alternation of the first active region and the second active region is repeated at a period twice the Bragg period.

With this arrangement, even if a certain amount of refractive-index-coupling component remains in the distributed feedback effect, such a component is caused merely by a higher order (i.e., the second order) diffraction, and therefore, influence of the refractive-index-coupling component is very small. Consequently, a gain-coupled DFB laser diode capable of achieving almost pure gain coupling can be provided.

Preferably, a high-reflective film is provided to one end surface of the laser diode.

By proving a high-reflective film on one end surface, highly concentrated output light can be extracted from this end surface. Because the gain-coupled DFB laser diode according to the invention conducts stable oscillation at a single oscillation wavelength, the stable operation will not be disturbed by the mirror (i.e., the high-reflective film) formed on one end surface.

One of the first active region and the second active region is made of a compound semiconductor material containing antimony as a group V element. For example, the first active region is made of InAlGaAs, and the second active region is made of AlGaAsSb.

A dimension of the first active region along a longitudinal axis of the laser diode is substantially the same as that of the second active region along the longitudinal axis of the laser diode.

With this arrangement, the type-IT hetero junction, that is, a gain region is repeated at a single interval, and efficient gain coupling is realized.

BRIEF DESCRIPTION OF THE DRAWINGS

Other objects, features, and advantages of the present invention will become more apparent from the following detailed description when read in conjunction with the accompanying drawings, in which:

FIG. 4A is a cross-sectional view of a gain-coupled DFB laser 100 taken along a plane perpendicular to the longitudinal axis of the wave guide, according to the first embodiment of the invention.

DETAILED DESCRIPTION OF THE PREFERED EMBODIMENTS

The preferred embodiments of the present invention will now be described in detail with reference to the attached drawings.

Prior to illustrating preferred examples, the principle of the present invention will be explained.

In the present invention, two heterogeneous semiconductors categorized in type-II are arranged periodically in the active layer of a distributed-feedback (DFB) laser, along the longitudinal axis thereof. Type-II semiconductors are semiconductors that produce a misaligned hetero junction structure.

Figure 1:
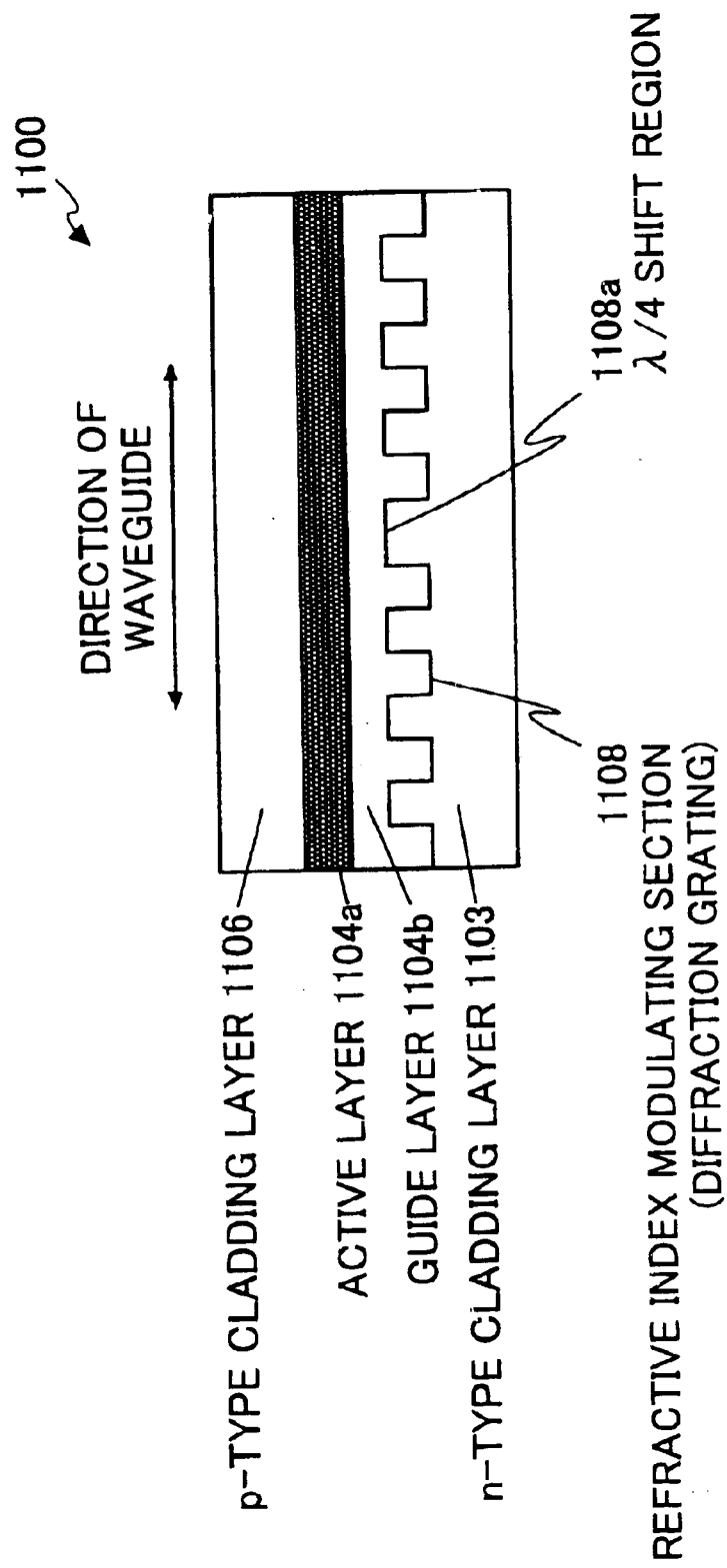
FIG. 1 is a cross-sectional view of a conventional quarter wavelength ($\lambda$/4) phase-shift refractive-index-coupled DFB laser taken along the longitudinal axis of the wave guide.
Figure 2:
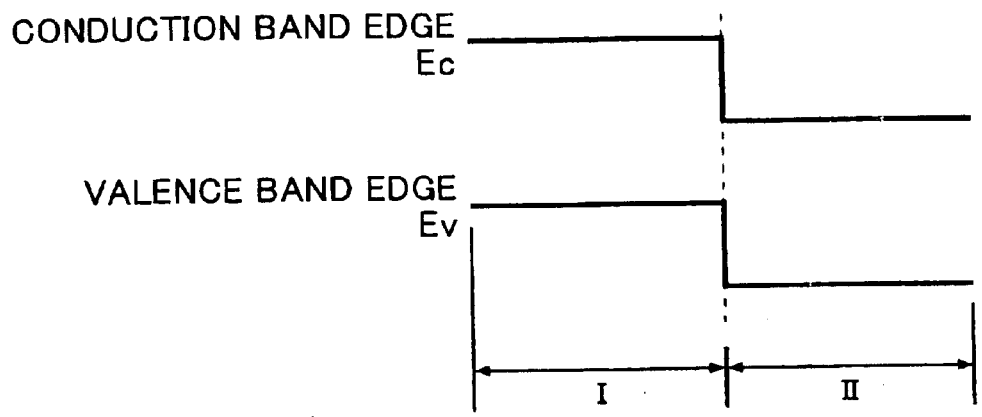
FIG. 2 illustrates a band structure of type-II hetero junction.

FIG. 2 illustrates the band structure of typical type-II hetero junction. In type-II hetero junction, the energy level Ec of the conduction band and the energy level Ev of the valence band of semiconductor I do not agree with the conduction band energy level Ec and the valence band energy level Ev of semiconductor II. In the example shown in FIG. 2, the energy level Ec of the conduction band and the energy level Ev of the valence band of semiconductor II are lower than those of semiconductor I.

Figures 3A, 3B:
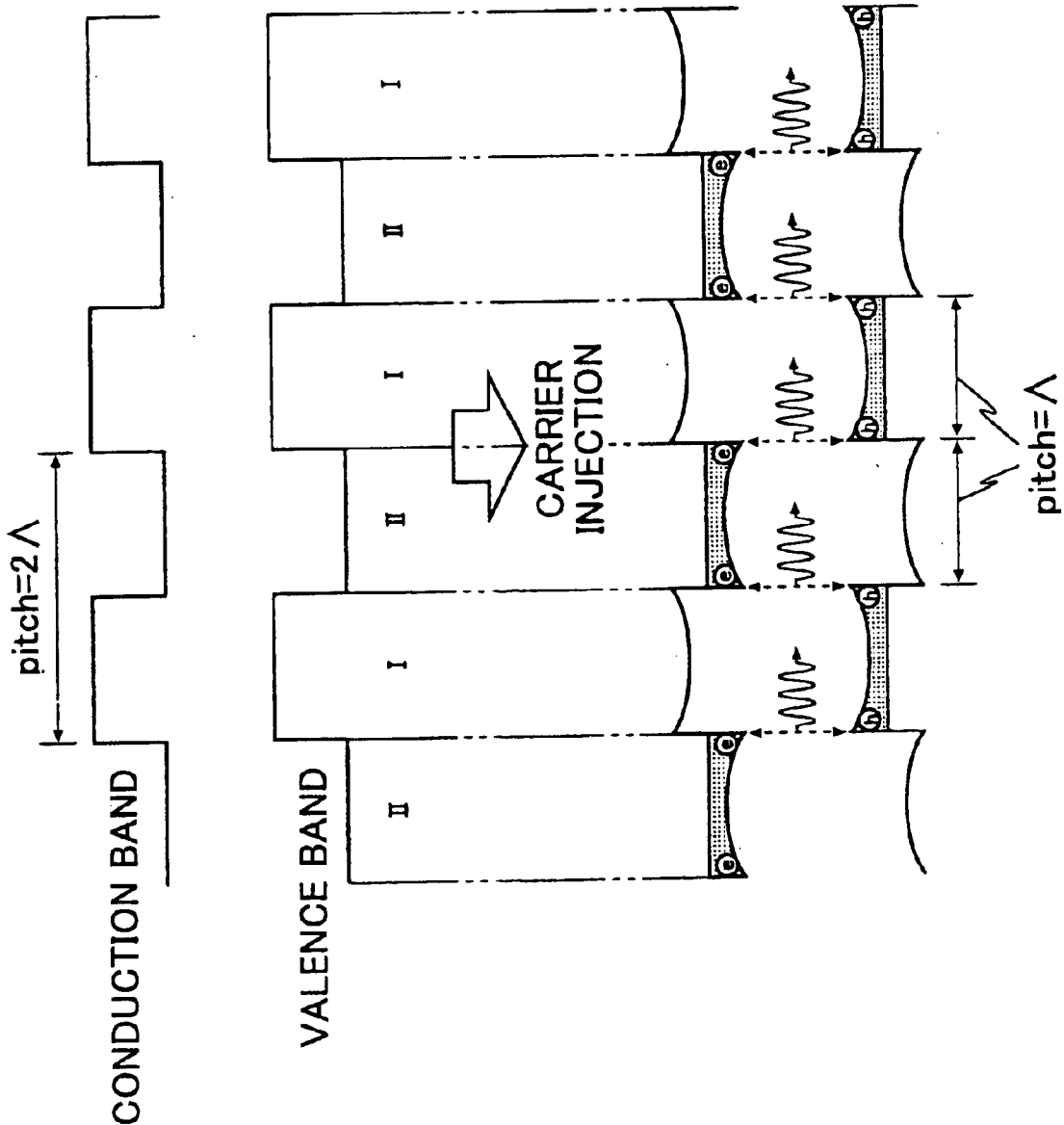
FIG. 3A illustrates an energy band gap structure of heterogeneous type-II semiconductors alternately arranged along the longitudinal axis of the waveguide before carriers are injected into the type-II semiconductors.
FIG. 3B illustrates an energy band gap structure after carriers are injected into the type-II semiconductors.

FIG. 3A illustrates a band structure of the type-II hetero junction arranged periodically in the active layer of a DFB laser diode along the longitudinal axis of the waveguide. FIG. 3B illustrates how the band structure of the type-II hetero junction changes when carriers are injected to the active layer having the band structure shown in FIG. 3A.

As illustrated in FIGS. 3A and 3B, region I and region II, which correspond to semiconductor I and semiconductor II, appear alternately in the active layer. When carriers (i.e., electrons and holes) are injected to the band structure shown in FIG. 3A, the electrons are accumulated in the conduction band of region II whose potential is lower than the conduction band of region I. On the other hand, the holes are accumulated in the valence band of region I whose potential is higher than the valence band of region II.

The electrons accumulated in the lower edge of the conduction band of region II are attracted to the holes accumulated in the higher edge of the valence band of region I, and consequently, electrons gather in the vicinity of region I. Similarly, the holes in the valence band of region I gather in the vicinity of region IT under the attraction of the electrons staying in the conduction band of region II. As a result, the energy band bends near the boundary of the hetero junction in both region I and region II, as illustrated in FIG. 3B. This causes still more electrons and the holes to concentrate at the bending edge, that is, the boundary of the hetero junction, and deformation of the energy gap and localization of electrons and holes further progress in regions I and II.

When the injected electrons and holes concentrate to or near the boundary between region I and region II, an electron and a hole recombine with each other and emit light at the boundary of hetero junction (which may be referred to as "hetero boundary). This results in gain to be produced. In other words, a gain-coupled DFB laser in which gain modulation occurs at a period of hetero boundary is provided. The wavelength of the oscillating light is determined by the band gap width between the conduction band and the valence band of each of the adjacent regions I and II, and by the period of the hetero boundary.

With the above-described structure of the gain-coupled DFB laser of the present invention, light emission (or gain modulation) occurs twice within a period of repetition of the pattern of the active layer. Consequently, the period (or pitch) of the pattern of the heterogeneous type-IT semiconductor materials used in the active layer can be made twice the Bragg period that is a target gain-modulation period. The pitch of the diffraction grating can be doubled, as compared with the conventional $\lambda/4$ shift refractive-index-coupled DFB laser. As a result, the fabrication process can be facilitated, and the yield rate increases.

The heterogeneous type-IT semiconductors have substantially the same index of refraction in order to eliminate or reduce the refractive-indexcoupling component to a negligible extent. Especially if the difference $\Delta n$ in the index of refraction between the heterogeneous type-II semiconductor materials is equal to or smaller than 0.004, the gain-coupled DFB layer of the present invention operates efficiently and ideally.

Even if a certain amount of refractive-index-coupling component is produced due to fabrication error, only higher order diffraction may occur with respect to the oscillation wavelength because the period of the refractive-index modulation is twice the Bragg period $\Lambda$. For this reason, influence of the refractive-index-coupling component on the oscillation wavelength can be reduced to one tenth, as compared with the conventional refractive-index-coupled DFB laser. Thus, influence of the refractive-index-modulation can be reduced to a negligible extent.

In two adjacent regions I and II, the same amount of electrons and holes are injected. Accordingly, change in index of refraction due to the plasma effect accompanying carrier injection can be cancelled out. Thus, the gain-coupled DFB laser according to the present invention is durable against adverse influence of carrier.

First Embodiment

Figure 4B:
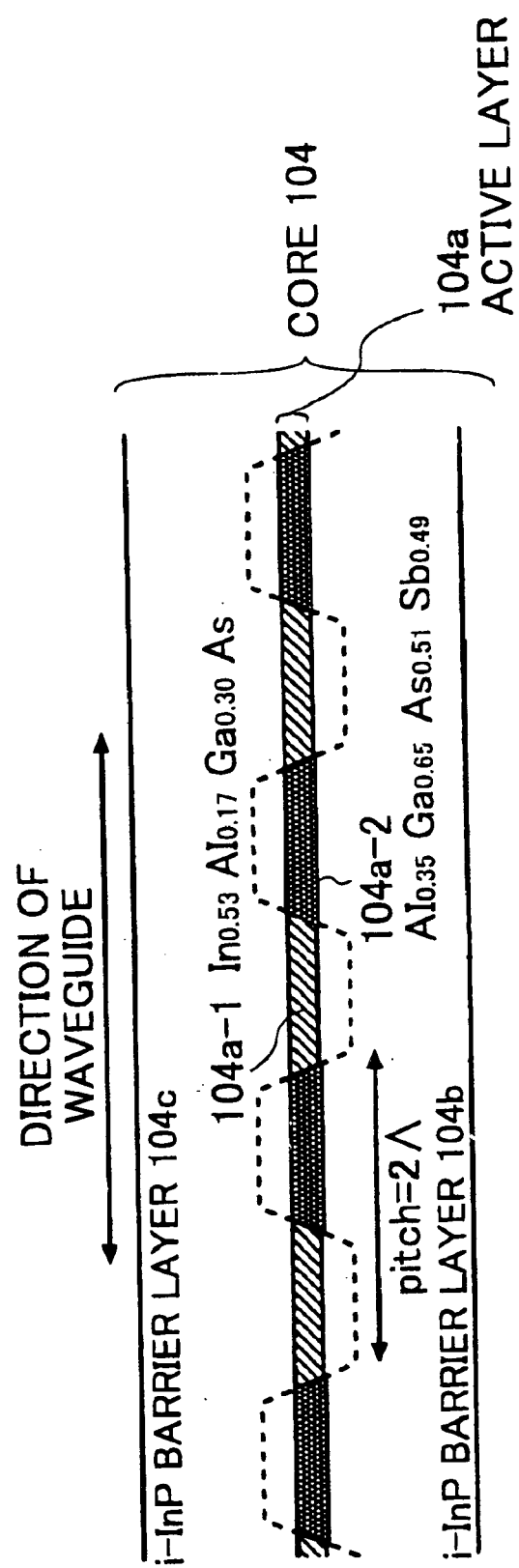
FIG. 4B is a cross-sectional view of the core structure taken along the longitudinal axis of the wave guide of the gain-coupled DFB laser 100 shown in FIG. 4A.
Figure 5:
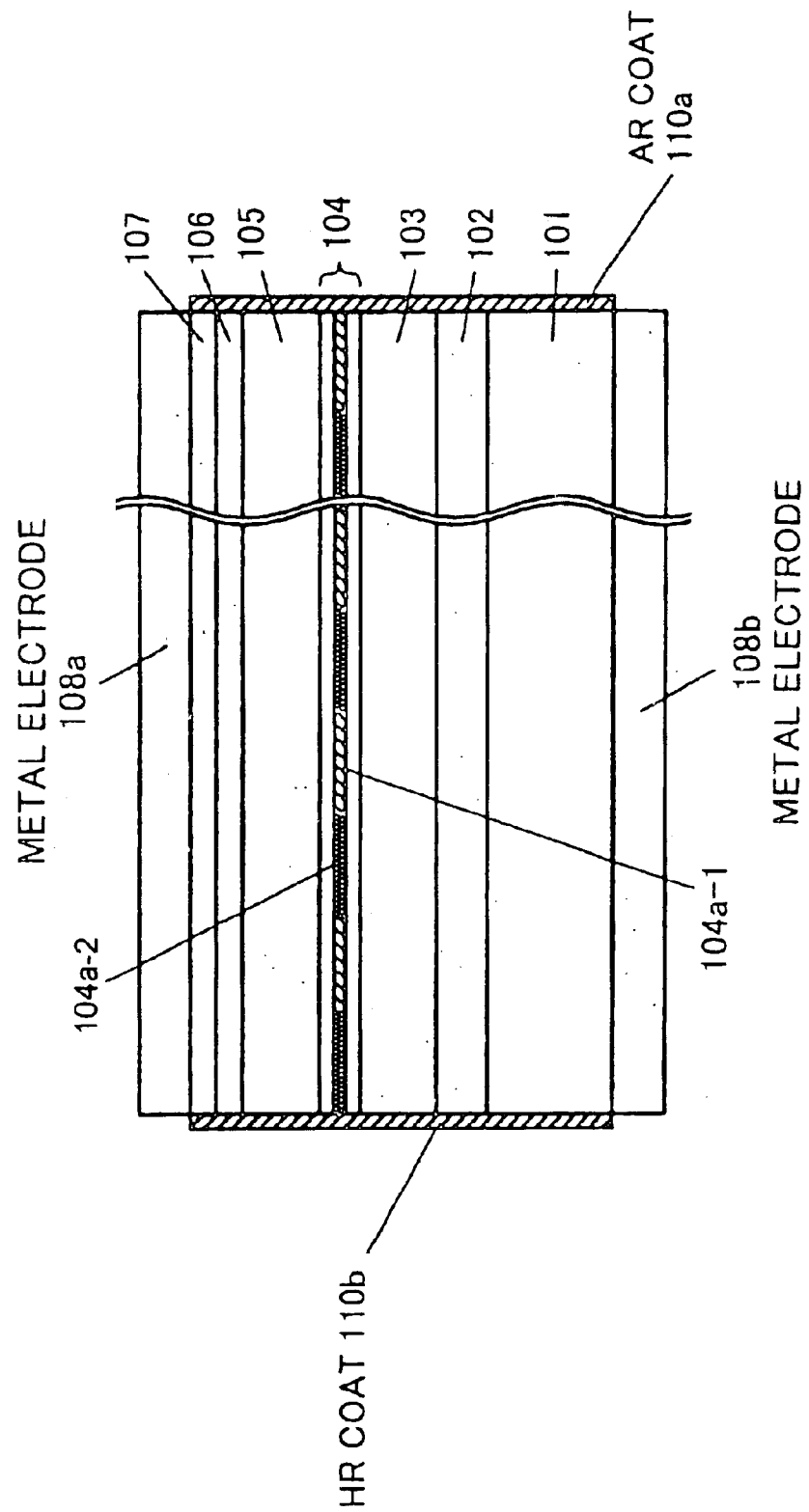
FIG. 5 is a cross-sectional view of the gain-coupled DFB 100 taken along the longitudinal axis of the wave guide according to the first embodiment of the invention.

FIGS. 4 through 6 illustrate a gain-coupled DFB laser 100 according to the first embodiment of the invention. In the first embodiment, the gain-coupled DFB laser 100 is fabricated on an indium phosphide (InP) substrate and oscillates at 1.3 $\mu$m (microns) region.

To define type-II hetero junction in the active layer, bulk crystal of antimony compound semiconductor material is used; however, any other materials that can define a type-II band structure can also be used.

FIG. 4A is a cross-sectional view of the gain-coupled DFB laser 100 taken along a plane perpendicular to the longitudinal axis of waveguide (i.e, the active layer), and FIG. 4B is a cross-sectional view of the active layer 104a of the gain-coupled DFB laser 100 taken along the longitudinal axis of the waveguide.

In FIG. 4A, the gain-coupled DFB laser 100 is fabricated on an n-type InP substrate 101 doped with n-type impurities. An n-type InP cladding layer 102 with a thickness of 1 $\mu$m, which is also doped so as to exhibit n-type conductivity, is positioned on the n-type InP substrate 101. On the n-type InP cladding layer 102 is formed an n-type $AlAs_xSb_{1-y}$ (y=0.51) layer 103 at a thickness of 1.5 microns.

A core layer 104 is positioned on the n-type $AlAs_{0.51}Sb_{0.49}$ layer 103. The core layer 104 includes semi-insulating InP (i-InP) barrier layers 104b and 104c, and an active layer 104a sandwiched by the i-InP barrier layers 104b and 104c. The thickness of i-InP barrier layer 104b and 104c is 0.1 microns, and the thickness of the active layer 104a is 0.05 microns. The total thickness of the core layer 104 becomes 0.25 microns.

The core layer 104 is covered with p-type $AlAs_{0.51}Sb_{0.49}$ layer 105 having a thickness of 1.5 microns. A p-type InP cladding layer 106 having a thickness of 0.5 microns is formed on the p-type $AlAs_{0.51}Sb_{0.49}$ layer 105, and a $p^+$-type InGaAs contact layer 107 with a thickness of 0.5 microns is formed on the p-type TnP cladding layer 106.

FIG. 4B is a cross-sectional view of the core 104 of the gain-coupled DFB laser 100 taken along the longitudinal axis of waveguide (i.e., the active layer 104a). The active layer 104a consists of heterogeneous semiconductors 104a-1 and 104a-2 that are arranged alternately at a predetermined interval (or a pitch A) in the direction of light propagation. In this example, the alternately arranged heterogeneous semiconductors are $In_{0.53}Al_{0.17}Ga_{0.30}As$ layer 104a-1 and $Al_{0.35}Ga_{0.65}As_{0.51}Sb_{0.49}$ layer 104a-2.

In the active layer 104a, $In_{0.53}Al_{0.17}Ga_{0.30}As$ layer 104a-1 and $Al_{0.35}Ga_{0.65}As_{0.51}Sb_{0.49}$ layer 104a-2 define the type-II energy band structure shown in FIG. 3A. The compositions of these two heterogeneous semiconductor layers 104a-1 and 104a-2 are determined so that the oscillation wavelength is in the 1.3-micron region, and that the difference in index of refraction between the semiconductor layers 104a-1 and 104a-2 is substantially zero. However, it should be noted that the gain-coupled DFB laser 100 according to the first embodiment operates appropriately as long as the refractive index difference $\Delta n$ between the heterogeneous semiconductor layers 104a-1 and 104a-2 does not exceed 0.004.

$In_{0.53}Al_{0.17}Ga_{0.30}As$ layer 104a-1 and $Al_{0.35}Ga_{0.65}As_{0.51}Sb_{0.49}$ layer 104a-2 are alternately arranged at period of $2*\Lambda$, where $\Lambda$ equals $\lambda/2n$ and "n" denotes the effective index of refraction. Under this arrangement, gain modulation is carried out at the Bragg period, while the refractive index modulation component is substantially reduced.

FIG. 5 is a cross-sectional view of the gain-coupled DFB laser 100 taken along the longitudinal axis of the waveguide. The gain-coupled DFB 100 may have an HR coating layer 10b on one end surface and have an AR coating layer 110a on the other end surface. With this arrangement, high output light can be obtained from the AR-coated end surface efficiently. Since the gain-coupled DFB laser 100 according to the first embodiment is superior in the single-wavelength characteristic, it has a sufficient capability as a WDM light source even if one end surface is coated with a high reflective (HR) coating layer. Of course, both end surfaces may be coated with AR coating.

Figure 6A:
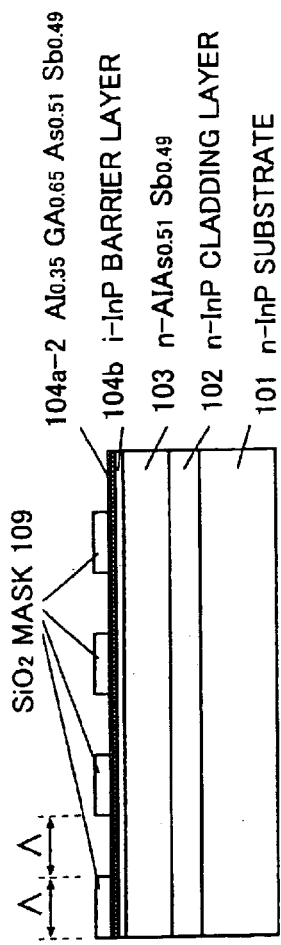
FIGS. 6A through 6C illustrate the fabrication process of the gain-coupled DFB laser 100 according to the first embodiment of the invention.
Figure 6B:
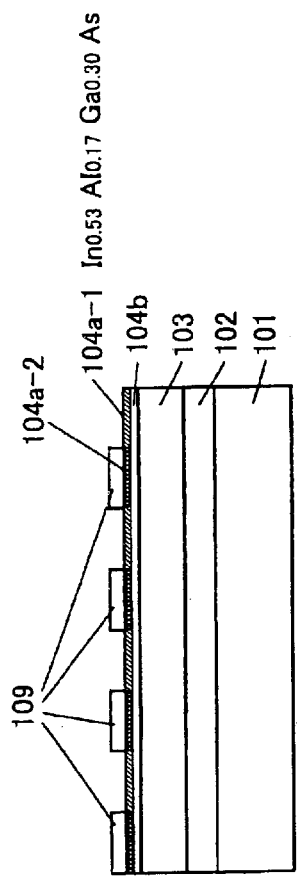
Figure 6C:
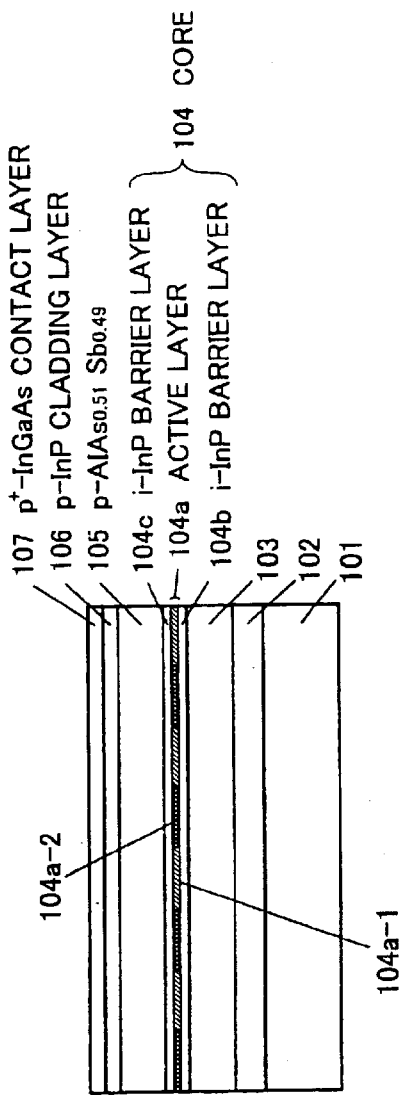

FIGS. 6A through 6C illustrate an example of fabrication process of the gain-coupled DFB laser 100.

First, as illustrated in FIG. 6A, an n-type InP cladding layer 102 with a thickness of 1 micron, an n-type $AlAs_{0.51}Sb_{0.49}$ layer 103 with a thickness of 1.5 microns, an i-InP barrier layer 104b with a thickness of 0.1 micron, and an $Al_{0.35}Ga_{0.65}As_{0.51}Sb_{0.49}$ layer 104a-2 with a thickness of 0.05 microns are subsequently grown on the n-type InP substrate 101 by MOVPE (metal organic vapor phase epitaxial).

Then, photo resist is formed on the $Al_{0.35}Ga_{0.65}As_{0.51}Sb_{0.49}$ layer 104a-2 using, for example, oxide film (such as $SiO_2$). The photo resist is patterned into a prescribed mask pattern by photo lithography to form a $SiO_2$ mask layer 109. The $SiO_2$ mask layer 109 has such a pattern that the $Al_{0.35}Ga_{0.65}As_{0.51}Sb_{0.49}$ layer 104a-2 is etched at a prescribed pitch in the direction of light propagation.

Then, as illustrated in FIG. 6B, exposed portion of the $Al_{0.35}Ga_{0.65}As_{0.51}Sb_{0.49}$ layer 104a-2, which is uncovered with the $SiO_2$ mask layer 109, is removed by dry etching. After the removal of the unmasked portion of the $Al_{0.35}Ga_{0.65}As_{0.51}Sb_{0.49}$ layer 104a-2, $In_{0.53}Al_{0.17}Ga_{0.30}As$ layer 104a-1 is formed by MOVPE until the $In_{0.53}Al_{0.17}Ga_{0.30}As$ layer 104a-1 reaches the same height as the $Al_{0.35}Ga_{0.65}As_{0.51}Sb_{0.49}$ layer 104a-2.

In order to allow the $In_{0.53}Al_{0.17}Ga_{0.30}As$ layer 104a-1 to grow only in the etched region, dielectric mask, such as $SiO_2$ mask layer 109, is used. This is because semiconductor does not grow on a dielectric layer formed on semiconductor during the MOVPE process.

When the $In_{0.53}Al_{0.17}Ga_{0.30}As$ layer 104a-1 has been formed, the $SiO_2$ mask layer 109 is removed by buffered HF (hydrofluoric acid). $In_{0.53}Al_{0.17}Ga_{0.30}As$ layer 104a-1 and $Al_{0.35}Ga_{0.65}As_{0.51}Sb_{0.49}$ layer 104a-2 are arranged alternately on the wafer along the longitudinal axis of the active layer 104a (that is, in the direction of light propagation).

Then, as illustrated in FIG. 6C, an i-InP barrier layer 104c with a thickness of 0.1 microns, a p-type $AlAs_{0.51}Sb_{0.49}$ layer 105 with a thickness of 1.5 microns, a p-type InP cladding layer 106 with a thickness of 0.5 microns, and a $p^+$-type InGaAs contact layer 107 with a thickness of 0.5 microns are subsequently formed by MOVPE.

Then, the metal electrodes 108a and 108b are formed, and an AR coating 110a and a HR coating 110b are provided to the end surfaces, as illustrated in FIG. 5. In this manner, the gain-coupled DFB laser 100 is completed.

Although in the first embodiment the oscillation wavelength λ is in the 1.3 μm region, the gain-coupled DFB laser 100 is applicable to the oscillation wavelength ranging from about 0.8 μm to 1.55 μm. In addition, oscillation light at still another wavelength region can be obtained by changing the type-II semiconductor materials and the pitch (i.e., the period) of the repetition structure.

In the first embodiment, a gain-coupled DFB laser diode with a high degree of design freedom and superior in the single-wavelength characteristic can be realized.

Even if a refractive index coupling component is produced in the gain-coupled DFB laser diode, it may cause only higher order of diffraction. Consequently, the gain-coupled DFB laser diode can provide almost ideal gain coupling, while sufficiently preventing the influence of the refractive index coupling component.

By providing a high reflective (HR) coating on one end surface of the gain-coupled DFB laser diode, output light can be concentrated on this end surface, and a high-output laser diode can be realized.

Since type-II hetero junction is repeated at a prescribed interval, gain coupling occurs efficiently, while facilitating the fabrication process.

Second Embodiment

Figure 7A:
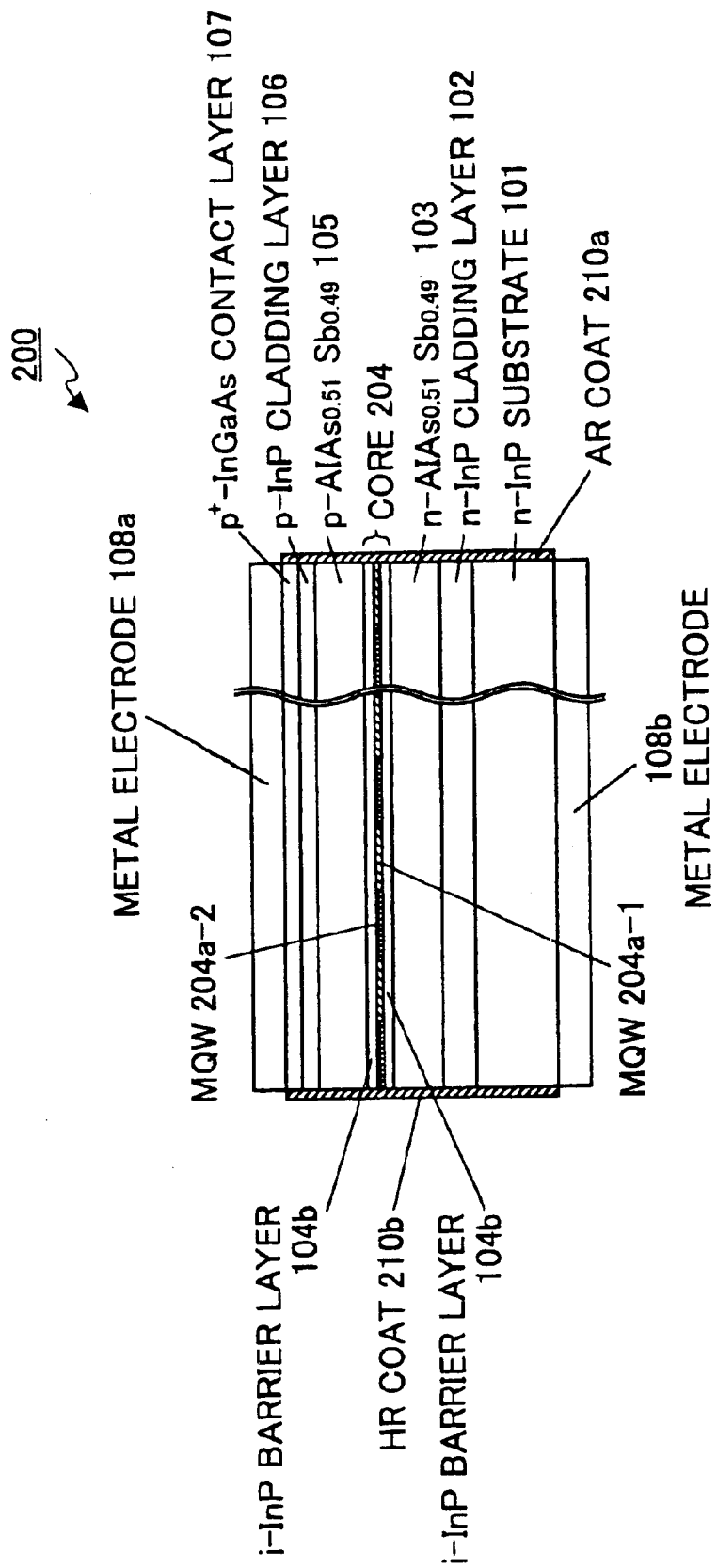
FIG. 7A is a cross-sectional view of a gain-coupled DFB laser 200 taken along the longitudinal axis of the waveguide according to the second embodiment of the invention.
Figure 7B:
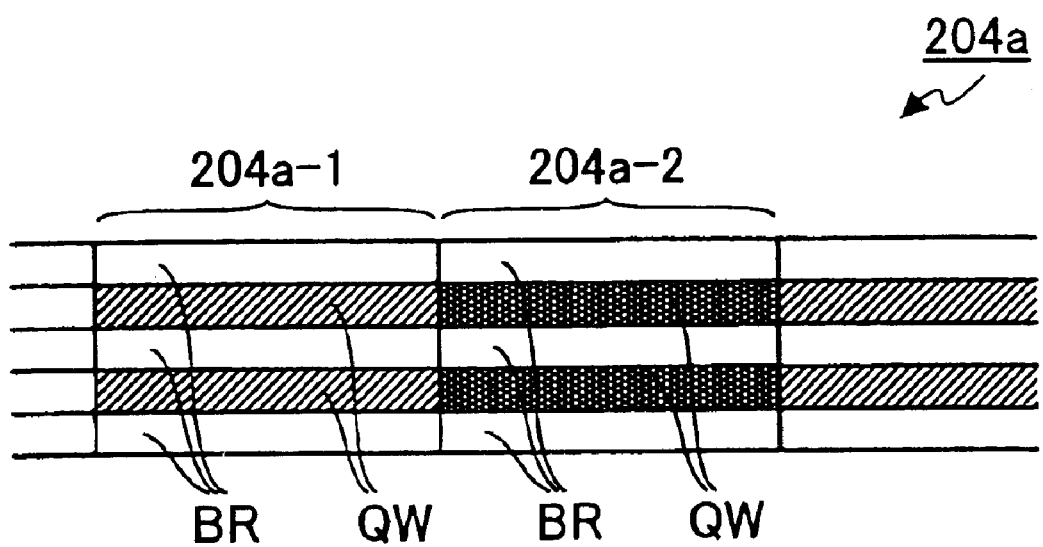
FIG. 7B is an enlarged cross-sectional view of the MQW structure employed in the gain-coupled DFB laser 200 shown in FIG. 7A.

FIG. 7A and FIG. 7B illustrate a gain-coupled DFB laser 200 according to the second embodiment of the invention. Type-II hetero junction of bulk crystals of homogeneous semiconductors explained in the first embodiment is applicable to a SQW (strained quantum well) structure or a MQW (multiple quantum well) structure. Accordingly, in the second embodiment, a gain-coupled DFB laser diode 200 has an active layer with an MQW structure including an InGaAsP quantum well that has a lattice constant matched with the InP substrate.

FIG. 7A is a cross-sectional view of the gain-coupled DFB laser 200 taken along the longitudinal axis of waveguide, and FIG. 7B is an enlarged view of the MQW structure having type-II hetero junction. The same elements as those shown in the first embodiment are denoted by the same numerical references, and explanation for them will be omitted.

The gain-coupled DFB laser 200 has a core 204 that includes an active layer 204a with the MQW structure. The active layer 204a comprises a first active region 204a-1 and a second active region 204a-2, which are repeated at a period twice the Bragg period Λ along the longitudinal axis of waveguide.

The first active region 204a-1 has a layered structure in which undoped InP barrier (BR) layers and undoped InGaAsP quantum well (QW) layers are layered alternately. The thickness of each InP barrier (BR) layer is 10 nm, and the thickness of each InGaAsP quantum well (QW) layer is 10 nm.

The second active region 204a-2 also has a layered structure in which undoped InP barrier (BR) layers and undoped AlGaAsSb quantum well (QW) layers are layered alternately.

At the boundary between the InGaAsP quantum well (QW) of the first active region 204a-1 and the AlGaAsSb quantum well (QW) of the second active region 204a-2 is formed type-II hetero junction. Since the first active region 204a-1 and the second active region 204a-2 are repeated periodically in the direction of light propagation, a gain region is produced repeatedly at the Bragg period Λ at each boundary between the first and second active regions 204a-1 and 204a-2.

To form the active layer having the MQW structure, InP barrier (BR) layers and undoped AlGaAsSb QW layers 204a-2 are grown alternately Then, a periodical $SiO_2$ mask pattern is formed on the top of the layered QW structure, and the unmasked portions of the alternate layers (BR and 204a-2) are removed (or etched). Then, InP barrier (BR) layers and InGaAsP QW layers 204a-1 are grown alternately in the etched portion so that the InGaAsP QW layers 204a-1 align with AlGaAsSb QW layers 204a-2. The other steps are the same as those described in the first embodiment, and an explanation for them will be omitted.

One end surface of the gain-coupled DFB laser 200 may be coated with a HR coating layer 210b. With this arrangement, high output light can be extracted from the other end, on which an antireflective (AR) coating layer is provided.

Since the combination of the first active region 204a-1 and the second active region 204a-2 is repeated at a period of 2Λ (that is twice the Bragg period Λ), the freedom in designing a laser structure is large, while greatly reducing the influence of refractive index modulation.

As has been described above, a gain-coupled DFB laser diode that is superior in the single-wavelength characteristic and in the degree of freedom of design can be provided.

Although the present invention has been described based on preferred embodiments, the invention is not limited to the embodiments, and there are many modifications and substitutions that can be made without departing from the scope of the present invention.

This patent application is based on and claims the benefit of the earlier filing date of Japanese Patent Application No. 2001-355287 filed Nov. 20, 2001.

What is claimed is:

1. A laser diode comprising:
    a first cladding layer having a first conductivity;
    a second cladding layer having a second conductivity;
    an active layer located between the first cladding layer and the second cladding layer and extending from one end surface to the other end surface, the active layer comprising a first active region and a second active region that are arranged alternately and periodically from said one end surface to the other end surface in a direction of light propagation, the first active region and the second active region defining type-II hetero junction;
    a first electrode configured to inject a carrier with a first polarity into the active layer via the first cladding layer; and
    a second electrode configured to inject a carrier with a second polarity into the active layer via the second cladding layer.

2. The laser diode according to claim 1, wherein the first active region has a first index of refraction, the second active region has a second index of refraction, and the absolute value of a difference between the first index of refraction and the second index of refraction is equal to or smaller than 0.004.

3. The laser diode according to claim 1, wherein alternation of the first active region and the second active region is repeated at a period twice the Bragg period.

4. The laser diode according to claim 2, wherein alternation of the first active region and the second active region is repeated at a period twice the Bragg period.

5. The laser diode according to claim 1, further comprising:
    a high-reflective film provided on said one end surface.

6. The laser diode according to claim 1, wherein one of the first active region and the second active region is made of a compound semiconductor material containing antimony as a group V element.

7. The laser diode according to claim 2, wherein one of the first active region and the second active region is made of a compound semiconductor material containing antimony as a group V element.

8. The laser diode according to claim 1, wherein the first active region is made of InAlGaAs, and the second active region is made of AlGaAsSb.

9. The laser diode according to claim 6, wherein the first active region is made of InAlGaAs, and the second active region is made of AlGaAsSb.

10. The laser diode according to claim 7, wherein the first active region is made of InAlGaAs, and the second active region is made of AlGaAsSb.

11. The laser diode according to claim 1, wherein the active layer is formed of a bulk crystal layer.

12. The laser diode according to claim 1, wherein the active layer has a multiple quantum well structure.

13. The laser diode according to claim 1, wherein a dimension of the first active region along a longitudinal axis of the laser diode is substantially the same as that of the second active region along the longitudinal axis of the laser diode.

* * * * *